United States Patent
Watanabe et al.

(10) Patent No.: US 9,355,817 B2
(45) Date of Patent: May 31, 2016

(54) ION MILLING DEVICE AND ION MILLING PROCESSING METHOD

(75) Inventors: Shunya Watanabe, Hitachinaka (JP); Mami Konomi, Hitachinaka (JP); Hisayuki Takasu, Oarai (JP); Atsushi Kamino, Naka (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 405 days.

(21) Appl. No.: 13/988,506

(22) PCT Filed: Nov. 21, 2011

(86) PCT No.: PCT/JP2011/076766
§ 371 (c)(1),
(2), (4) Date: May 20, 2013

(87) PCT Pub. No.: WO2012/070517
PCT Pub. Date: May 31, 2012

(65) Prior Publication Data
US 2013/0240353 A1    Sep. 19, 2013

(30) Foreign Application Priority Data
Nov. 22, 2010 (JP) .................... 2010-260134

(51) Int. Cl.
*C23C 14/34* (2006.01)
*H01J 37/305* (2006.01)
*H01J 37/20* (2006.01)

(52) U.S. Cl.
CPC ........... *H01J 37/3053* (2013.01); *H01J 37/20* (2013.01); *H01J 2237/2001* (2013.01); *H01J 2237/20207* (2013.01); *H01J 2237/2802* (2013.01); *H01J 2237/31745* (2013.01)

(58) Field of Classification Search
CPC ............. H01J 37/20; H01J 37/3053; H01J 2237/2001; H01J 2237/20207; H01J 2237/2802; H01J 2237/31745

USPC ........... 204/192.34, 298.36; 250/424, 442.11
See application file for complete search history.

(56) References Cited

U.S. PATENT DOCUMENTS 7,297,944 B2   11/2007   Kodama et al.
7,722,818 B2   5/2010   Hasegawa et al.
(Continued)

FOREIGN PATENT DOCUMENTS

JP    9-293475 A    11/1997
JP    2004-47315 A    2/2004
(Continued)

OTHER PUBLICATIONS

International Search Report issued in International Application No. PCT/JP2011/076766 mailed Dec. 20, 2011.
Notice of Submission of Argument Korean Patent Application No. 10-2013-7012996 dated Feb. 11, 2015 with full English translation.

*Primary Examiner* — Rodney McDonald
(74) *Attorney, Agent, or Firm* — McDermott Will & Emery LLP

(57) ABSTRACT

The sample 3 is tilted/oscillated with respect to the optical axis (Z-axis) of the ion beam 2 to repeat tilt and tilt/restoration of a processing target surface 3a of the sample 3 between a surface state in which the processing target surface 3a of the sample 3 faces a tilt axis direction (Y-axis direction) and a tilted surface state in which a portion of the processing target surface 3a on the sample stage side protrudes in the tilt axis direction (Y-axis direction) than does a portion of the processing target surface 3 on the mask side, so that the processing target surface 3a is irradiated with the ion beam 2 at a low angle, and projections/recesses 63 derived from a void 61 or a dissimilar material 62 are suppressed. Accordingly, it is possible to suppress generation of projections/recesses derived from a void or dissimilar material in fabrication of a cross section sample, and thus fabricate a sample cross section suitable for observation/analysis.

6 Claims, 7 Drawing Sheets

(56) References Cited

U.S. PATENT DOCUMENTS

2005/0118065 A1\* 6/2005 Hasegawa et al. .............. 422/99
2005/0236587 A1\* 10/2005 Kodama et al. .......... 250/492.21

FOREIGN PATENT DOCUMENTS

| JP | 2005-091094 A | 4/2005 |
| JP | 2009-025133 A | 2/2009 |

\* cited by examiner (a)

(b)

(c)

(a)

(b)

ION MILLING DEVICE AND ION MILLING PROCESSING METHOD

RELATED APPLICATIONS

This application is the U.S. National Phase under 35 U.S.C. §371 of International Application No. PCT/JP2011/076766, filed on Nov. 21, 2011, which in turn claims the benefit of Japanese Application No. 2010-260134, filed on Nov. 22, 2010, the disclosures of which Applications are incorporated by reference herein.

TECHNICAL FIELD

The present invention relates to an ion milling device and an ion milling processing method that are used for fabrication of a cross section of a sample to be observed with a scanning electron microscope, for example.

BACKGROUND ART

An ion milling method is a processing method for cutting or polishing a sample using a sputter phenomenon in which accelerated ions are caused to collide with a sample to be processed in a vacuum, and the collided ions then sputter atoms or molecules from the sample. In this case, by disposing a mask, which serves as a shielding plate against an ion beam, on the surface of the sample in the beam irradiation direction in advance, it becomes possible to sputter only a portion of the surface of the sample that protrudes from an end surface of the mask, and thus process a smooth sample cross section that is along the optical axis direction of the ion beam.

Such an ion milling method is used to process a metal, glass, ceramics, electronic parts, a composite material, and the like. For example, with respect to electronic parts, such a method is used as a method of fabricating a cross section of a sample to be observed in acquiring an image of the configuration, an image of the sample composition, or a channeling image using a scanning electron microscope (SEM) or the like, or in acquiring X-ray analysis, crystal orientation analysis, or the like, with a view to analyze the internal structure, cross-sectional lamination shape, film thickness evaluation, crystalline state, failure, or a cross section of a foreign substance.

Herein, as a method of fabricating a sample cross section, mechanical processing methods such as a cutting method and a mechanical polishing method are also known. However, there has been a problem that, with such mechanical processing methods, it is difficult to process a composite material containing materials with different hardness and thus eliminate the influence of stress applied thereto, requiring a high skill.

In contrast, an ion milling method, which is a method using a sputter phenomenon of ions, is a sample cross section fabrication method in which physical stress is not applied to a processing target. This method enables processing of a sample that is difficult to be cut or polished mechanically, such as a soft material or a material containing voids.

In an ion milling method, a mask is disposed as a shielding plate on a sample surface in the beam irradiation direction, that is, on the non-processing target region of the sample surface on the beam incident side, and then the sample surface on which the mask is disposed is irradiated with an argon ion beam, for example, to remove a portion of the sample that protrudes from the mask through sputtering, whereby a processed surface that is along the optical axis direction of the ion beam can be acquired. According to such a processing method that applies the ion milling method using an ion beam, it is possible to, even when the sample is a composite material containing materials with different hardness, fabricate a smooth sample cross section with reduced influence of the difference of materials. Further, it is also possible to easily obtain a sample cross section in a smooth and clean mirror surface condition without distortions.

Patent Literature 1 discloses an ion milling device having an ion beam irradiation means disposed in a vacuum chamber for irradiating a sample with an ion beam, a tilt stage disposed in the vacuum chamber and having a tilt axis in a direction substantially perpendicular to the ion beam, a sample holder disposed on the tilt stage for holding the sample, and a shielding material located above the tilt stage for partially blocking the ion beam that irradiates the sample, wherein ion beam sample processing is allowed to be performed by changing the tilt angle of the tilt stage. Patent Literature 1 also discloses a configuration in which an optical microscope for adjusting the position of the sample is attached to the upper end of a sample stage drawing mechanism having the tilt stage attached thereto.

Patent Literature 2 discloses, with respect to an ion milling device, a sample holder for holding a sample as well as a holder fixture for fixing the sample holder on a jig receiving table for a focused ion beam device and a jig receiving table for a scanning electron microscope.

CITATION LIST

Patent Literature

Patent Literature 1: JP Patent Publication No. 2005-91094A
Patent Literature 2: JP Patent Publication No. 9-293475A

SUMMARY OF INVENTION

Technical Problem

As described above, an ion-milling method is a method of processing a cross section without applying pressure, using a sputter phenomenon of ions of an argon ion beam, for example. Therefore, there is no need to take into consideration the influence of stress applied to a sample to be processed, which is problematic for a method such as mechanical cutting or polishing.

However, in the ion milling method, if a sample to be processed contains a void or materials with compositions that differ in sputter efficiency, a phenomenon would occur in which thread-like projections/recesses are generated on the processing target surface as if a skirt is trailed from the portion of the void or the materials (curtain effect). This phenomenon concerns the shape and size of the void or the difference in the sputter efficiency of the dissimilar materials, and the size of the thread-like projections/recesses would differ accordingly. Such thread-like projections/recesses generated on the processed sample cross section of the sample would obstruct observation or analysis of a plane. Thus, such projections/recesses are preferably not generated in the fabrication of a sample cross section.

In each of the aforementioned ion milling devices described in Patent Literature 1 and 2, a sample holder holding a sample is fixedly disposed, and a tilt stage (a sample stage) having a tilt axis, which is substantially perpendicular to the optical axis of an ion beam, is caused to repeatedly tilt (swing) about the tilt axis in a reciprocating manner so that generation of thread-like projections/recesses on the processed surface of the fabricated cross section is reduced, but it is impossible to completely prevent the generation. In particular, when a sample to be processed contains a void or materials with compositions that differ in sputter efficiency, it has been impossible to prevent generation of thread-like projections/recesses on the processed cross section even if the tilt stage (the sample stage) is caused to repeatedly tilt (swing) about the tilt axis in a reciprocating manner.

The present invention has been made in view of the foregoing problems, and aims at providing an ion milling device and an ion milling processing method that can, even when a sample to be processed contains voids or materials with compositions that differ in sputter efficiency, suppress generation of thread-like projections/recesses and thus can fabricate a sample cross section that is suitable for observation/analysis.

Solution to Problem

In order to solve the aforementioned problems, the present invention provides an ion milling device including a swinging mechanism that shakes a sample table about a tilt axis, which is perpendicular or substantially perpendicular to an optical axis of an ion beam emitted from an ion beam source, to shake a processing target surface of a sample that is held on the sample table and is partially shielded from the ion beam by a mask, along a plane that is perpendicular to a plane defined by the optical axis of the ion beam and the tilt axis; and a tilt-oscillation mechanism that shakes the sample held on the sample table about an axis that is perpendicular to the plane defined by the optical axis of the ion beam and the tilt axis along the plane defined by the optical axis of the ion beam and the tilt axis, between a surface state in which the processing target surface of the sample faces the tilt axis direction and is along the optical axis direction of the ion beam and a surface state in which the processing target surface of the sample is tilted in the optical axis direction of the ion beam toward the ion beam source side and in which the processing target surface of the sample crosses the optical axis of the ion beam at a low angle.

In addition, an ion milling processing method of the present invention includes a cross section producing step of, by shaking a sample table about a tilt axis, which is perpendicular or substantially perpendicular to an optical axis of an ion beam emitted from an ion beam source, to shake a processing target surface of a sample that is held on the sample table and is partially shielded from the ion beam by a mask, along a plane that is perpendicular to a plane defined by the optical axis of the ion beam and the tilt axis, producing a processing target surface of the sample that is defined by the mask and is along the optical axis of the ion beam; and a smoothing step of smoothing thread-like projections/recesses produced on the processing target surface of the sample by execution of the cross section producing step by shaking the sample held on the sample table about an axis that is perpendicular to the plane defined by the optical axis of the ion beam and the tilt axis along the plane defined by the optical axis of the ion beam and the tilt axis, between a surface state in which the processing target surface of the sample faces the tilt axis direction and is along the optical axis direction of the ion beam and a surface state in which the processing target surface of the sample is tilted in the optical axis direction of the ion beam toward the ion beam source side and in which the processing target surface of the sample crosses the optical axis of the ion beam at a low angle.

The present specification contains subject matter disclosed in the specification and/or drawings of Japanese Priority Patent Application JP 2010-260134 that forms the basis of the priority claim of the present application.

Advantageous Effects of Invention

According to the present invention, it is possible to suppress generation of projections/recesses derived from a void or a dissimilar material in fabrication of a cross section sample and thus fabricate a sample cross section that is suitable for observation/analysis.

DESCRIPTION OF EMBODIMENTS

An embodiment of an ion milling device and an ion milling processing method in accordance with the present invention will be described with reference to the drawings.

Figure 1:
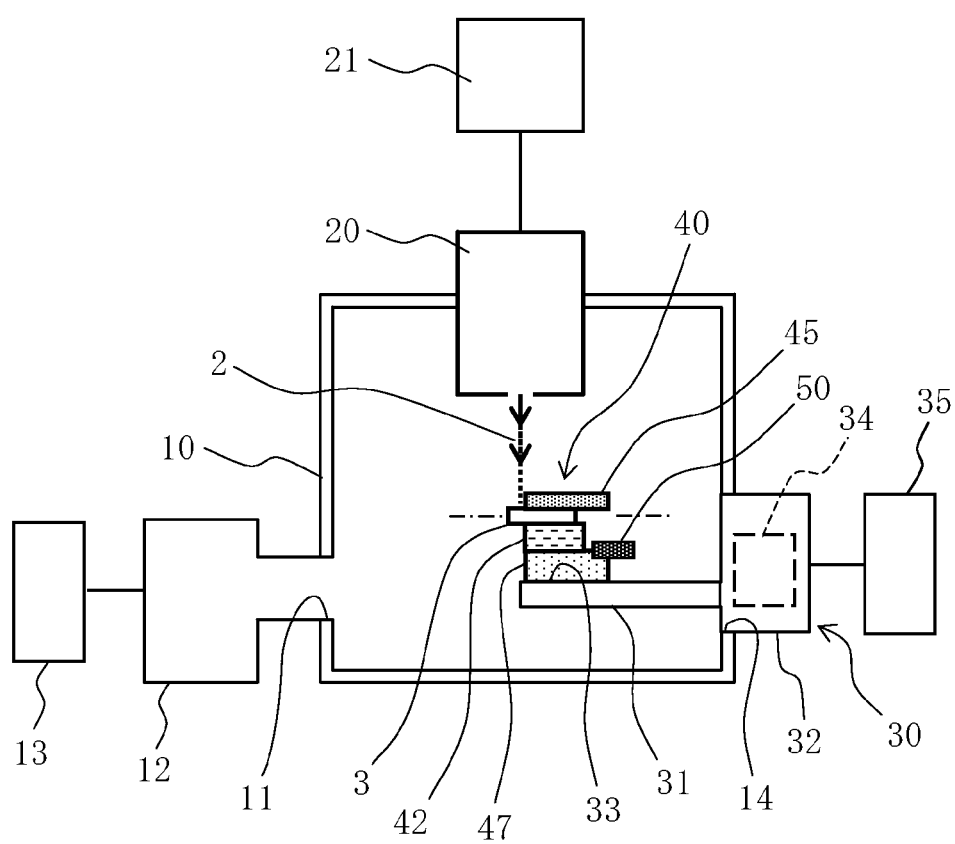
FIG. 1 shows an overall structure diagram of an ion milling processing device in accordance with an embodiment of the present invention.

FIG. 1 shows an overall structure diagram of an ion milling processing device in accordance with an embodiment of the present invention.

The ion milling device 1 includes a vacuum chamber 10, an ion gun 20, which serves as an ion beam source that irradiates a sample 3 with an ion beam 2, and a sample stage 30 that holds a sample table oscillation unit 40 on which the sample 3 is held.

The vacuum chamber 10 has a housing structure with which the chamber can be evacuated or be held in the atmospheric pressure condition. The inside of the chamber communicates with a vacuum exhaust system 12 via an exhaust port 11 formed in the chamber housing. The vacuum exhaust system 12 is actuation-controlled by a vacuum exhaust system control unit 13, and adjusts the internal pressure condition of the vacuum chamber 10 to vacuum or the atmospheric pressure condition.

The ion gun 20 is provided on the chamber housing of the vacuum chamber 10 so that its beam emitting portion faces the chamber from the upper face of the chamber housing. For the ion gun 20, an irradiation system that irradiates the sample 3 in the chamber with an ion beam (a broad ion beam) 2 is formed as an ion beam source. The ion gun 20 is actuation-controlled by an ion gun control unit 21, and adjusts irradiation of the sample 3 with the ion beam 2 as well as the current density. Hereinafter, description will be made on the assumption that the ion gun 20 emits an argon ion beam. Note that it is acceptable as long as the ion gun 20 as the ion beam source is a gun that generates an ion beam (e.g., an ion beam of other noble gas, nitrogen, or the like) capable of ion milling processing, and the ion beam 2 is not limited to an argon ion beam.

The sample 3 to be processed is held on a sample table 42 of the sample table oscillation unit 40. The sample table oscillation unit 40 includes the sample table 42 on which the sample 3 is held, a mask 45 that partially shields the sample 3 held on the sample table 42 against the ion beam 2, a movable table 47 that holds the sample table 42 in an oscillatable manner with respect to the sample stage 30, and an oscillator 50 that oscillates the movable table 47. The sample table oscillation unit 40 is tiltably and oscillatably held on the sample stage 30 as described below.

The sample stage 30 has a tilt stage portion 31 and a cap portion 32. A unit holding portion 33 that tiltably and oscillatably holds the sample table oscillation unit 40 is formed on the tip end of the tilt stage portion 31. The sample stage 30 is movably attached to the chamber housing of the vacuum chamber 10 along linear guides (not shown). Along with the movement of the sample stage 30, the tilt stage portion 31 can be carried into and taken out of the chamber via a sample transport port 14 formed in the chamber housing wall of the vacuum chamber 10.

Then, the sample stage 30 is moved forward along the linear guides (not shown), and the cap portion 32 is attached to the sample transport port 14 of the vacuum chamber 10 in a state in which the tilt stage portion 31 is introduced into the chamber, whereby the inside of the chamber can be isolated from the outside in an airtight manner. In this case, the unit holding portion 33 of the tilt stage portion 31 and the sample table oscillation unit 40 held by the unit holding portion 33 can be positioned in the vacuum chamber below the beam emitting portion of the ion gun 20. Meanwhile, when the cap portion 32 is removed from the sample transport port 14 of the vacuum chamber 10, the sample stage 30 is moved back along the linear guides (not shown) and the tilt stage portion 31 is taken out of the chamber, the unit holding portion 33 of the tilt stage portion 31 as well as the sample table oscillation unit 40 held by the unit holding portion 33 can be caused to appear from the sample transport port 14. In such a state, the sample table 42 on which the sample 3 is held can be put on or removed from the movable table 47, and position adjustment of the mask 45 with respect to the sample 3 can be performed.

Further, the sample stage 30 has a tilt axis of the tilt stage portion 31 that is perpendicular or substantially perpendicular to the optical axis of the ion beam 2 in a state in which the tilt stage portion 31 is carried into the chamber and the cap portion 32 is attached to the sample transport port 14. In the example shown, the tilt axis extends within the chamber in parallel with a direction in which the tilt stage portion 31 extends in the chamber so that the tilt axis passes through the sample 3 on the sample table oscillation unit 40 held by the unit holding portion 3 or the vicinity thereof.

Corresponding to the tilt axis, a sample stage driving mechanism 34 for repeatedly shaking the tilt stage portion 31 about the tilt axis within a predetermined rotation range is accommodated in the cap portion 32 on the base end side of the tilt stage portion 31. Actuation of the sample stage driving mechanism 34 as well as the oscillator 50 described below is controlled by a sample table control unit 35.

When the tilt stage portion 31 is shaken about the tilt axis by the actuation of the sample stage driving mechanism 34, the sample 3 held on the sample table 42 of the sample table oscillation unit 40 is repeatedly tilted and tilted/restored with respect to, provided that a direction that is orthogonal to a plane defined by the tilt axis and the optical axis of the ion beam 2 is a horizontal direction in which the sample 3 is not tilted, the horizontal direction in synchronization with the shake period. Along this, the sample surface of the sample 3 that faces the tilt axis direction is also repeatedly tilted and tilted/restored with respect to the horizontal direction along the plane that is orthogonal to the plane defined by the tilt axis and the optical axis of the ion beam 2. The sample table control unit 35 is configured to be able to freely set the tilt angle and the tilt rate of the sample 3 held on the sample table 42 of the sample table oscillation unit 40 by changing the range and period of the shake of the tilt stage portion 31 about the tilt axis.

When the inside of the vacuum chamber is airtightly sealed off from the outside by attaching the cap portion 32 of the sample stage 30 to the sample transport port 14, actuation of the vacuum exhaust system 12 is controlled by the vacuum exhaust system control unit 13 so that the vacuum exhaust system 12 evacuates the atmosphere in the vacuum chamber and holds the vacuum chamber in the vacuum condition. Meanwhile, when the sample transport port 14 is to be opened by removing the cap portion 32 from the sample transport port 14 and moving the sample stage 30, actuation of the vacuum exhaust system 12 is controlled by the vacuum exhaust system control unit 13 so that the atmosphere in the vacuum chamber is restored from the vacuum condition to the atmospheric pressure condition in advance.

Next, the structure of the sample table oscillation unit 40 that is fixedly held on the unit holding portion 33 of the tilt stage portion 31 of the sample stage 30 will be described.

Figure 2:
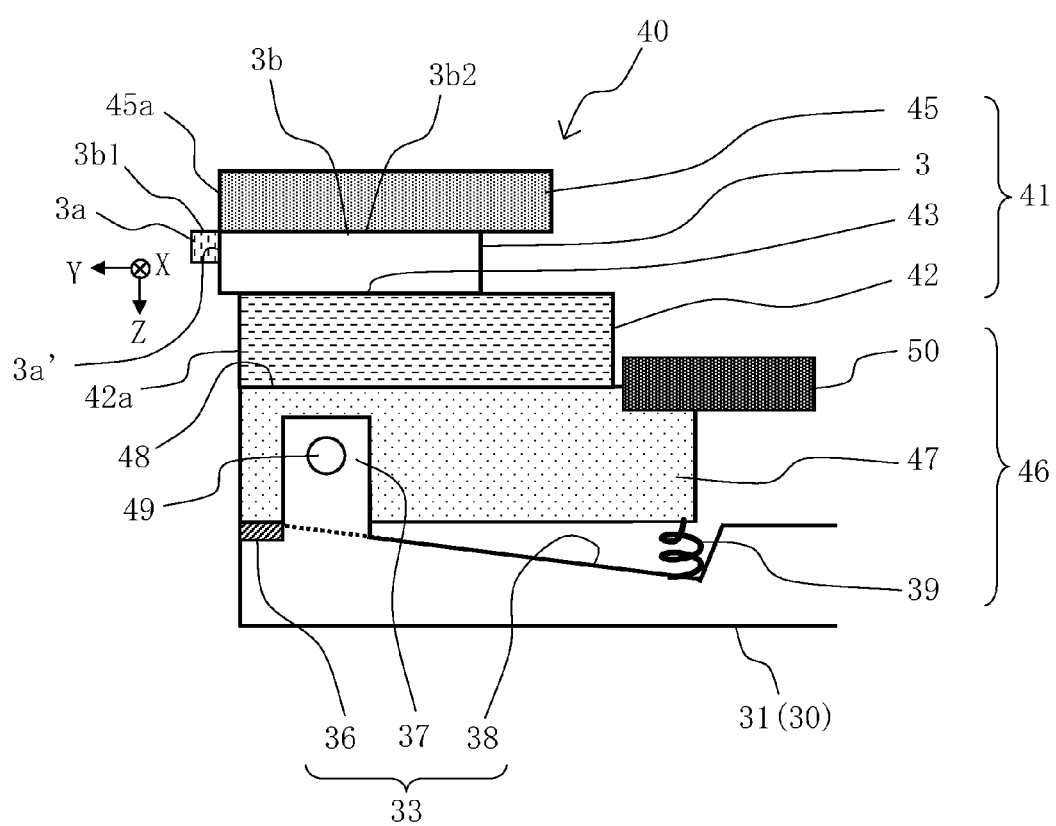
FIG. 2 is a schematic structure diagram of an embodiment of a sample table oscillation unit of an ion milling processing device in accordance with this embodiment.

FIG. 2 is a schematic structure diagram of an embodiment of the sample table oscillation unit of the ion milling processing device in accordance with this embodiment.

Note that among the coordinate axes indicated in FIG. 2, the Z-axis represents the optical axis direction of the ion beam 2 emitted from the ion gun 20 shown in FIG. 1 or a direction parallel with such direction, the Y-axis represents the tilt axis direction of the tilt stage portion 31 of the sample stage 30, which is perpendicular or substantially perpendicular to the optical axis of the ion beam 2, or a direction parallel with such direction, and the X-axis represents a direction orthogonal to the optical axis of the ion beam 2 and the tilt axis of the tilt stage portion 31.

The sample table oscillation unit 40 includes a mask unit portion 41 and a movable portion 46. The movable portion 46 detachably holds the mask unit portion 41, and is tiltably and oscillatably attached to the unit holding portion 33 of the tilt stage portion 31 of the sample stage 30 as described below.

The mask unit portion 41 is configured as an assembly having the sample table 42 on which the sample 3 is fixed and the mask 45 that partially shields the sample 3 fixed on the sample table 42 from the emitted ion beam 2.

The sample table 42 has formed thereon a sample mount surface 43 on which the sample 3 is mounted. In addition, one end surface 42a of the sample table 42 serves as a reference plane for adjusting the orientation of a processing target surface 3a of the sample 3 when mounting the sample 3 on the sample mount surface 43. The sample 3 is fixedly mounted on the sample mount surface such that the orientation of its processing target surface 3a coincides with the orientation of the one end surface 42a of the sample table 42.

The mask 45 is disposed above the sample table 42 having the sample mount surface on which the sample 3 is fixedly mounted, with the sample 3 interposed therebetween. The mask 45 defines an irradiation target region 3b1 to be irradiated with the ion beam 2 of the sample 3 fixedly mounted on the sample mount surface of the sample table 42 by adequately exposing a processing target surface portion of a surface 3*b*, which is on the opposite side of the sample mount surface, of the sample 3 so that the processing target surface portion can be irradiated with the ion beam 2 in accordance with the amount of cutting or polishing. Meanwhile, the mask 45 covers the remaining portion of the surface 3*b* as a shielded region 3*b*2 so that it is not irradiated with the ion beam 2. Therefore, in the example shown, a mask end surface 45*a*, which extends in a straight line, of the mask 45 defines a smooth sample cross section that is along the optical direction (Z-axis direction) of the ion beam 2, as a final processed surface 3*a*' obtained after the processing through irradiation with the ion beam 2.

The mask unit portion 41 as an assembly having the sample table 42 and the mask 45 is provided with a fine adjustment mechanism (not shown). The fine adjustment mechanism finely adjusts the arrangement of the mask 45 with respect to the sample table 42 and the sample 3 fixedly mounted on the sample mount surface 43 thereof. The fine adjustment mechanism moves the mask end surface 45*a* of the mask 45 back in the Y-axis direction on the surface of the sample 3 fixedly mounted on the sample table 42, so that the boundary position between the shielded region 3*b*2 and the irradiation target region 3*b*1 on the surface of the sample 3 is displaced, and the amount of cutting or the amount of polishing is finely adjusted. In addition, the fine adjustment mechanism rotates the sample table 42 relative to the mask 45 to finely adjust the orientation of the final processed surface 3*a*' of the sample 3 fixedly mounted on the sample table 42 so that it coincides with the orientation (Y-axis direction) of the mask end surface 45*a* of the mask 45. The mask unit portion 41 is detachably attached to the movable table 47 of the movable portion 46 that is oscillatably attached to the unit holding portion 33 of the tilt stage portion 31.

Meanwhile, the movable portion 46 includes the movable table 47 and the oscillator 50 that oscillates the movable table 47. The movable table 47 is configured such that its mount surface 48 abuts the rear surface of the sample mount surface 43 of the sample table 42 of the mask unit portion 41, and the mask unit portion 41 is detachably attached to the movable table 47 by a fastening means (not shown). A shaft portion 49 is formed to project at opposite planes, which extend along a plane (a Z-Y plane) defined by the optical axis (Z-axis) of the ion beam 2 and the tilt axis (Y-axis) of the tilt stage portion 31 of the movable table 47, at end sides in the longitudinal direction thereof.

Meanwhile, the unit holding portion 33 of the tilt stage portion 31 of the sample stage 30 has a structure in which a stopper portion 36, a shaft attachment portion 37, and a recessed portion 38 are sequentially provided from the tip end side of the tilt stage portion 31.

The stopper portion 36 supports the movable table 47 so that a portion of one end side of the rear surface, which is opposite to the mount surface 48, of the movable table 47 of the sample table oscillation unit 40 abuts the stopper portion 36 in the tilt axis direction (Y-axis direction) and the mount surface 48 is perpendicular to the optical axis (Z-axis) of the ion beam 2.

The shaft attachment portion 37 is arranged in a standing condition toward the mount side of the sample table oscillation unit 40 from the opposite sides of the tilt stage portion 31 in the width direction (X-axis direction), so that the shaft portion 49 formed to project at opposite planes of the movable table 47 engages the shaft attachment portion 37, and thus the shaft attachment portion 37 rotatably and displaceably supports the movable table 47 or the sample table oscillation unit 40 about the shaft portion 49.

The recessed portion 38 is formed with an inclined plane that extends from the tip end side toward the base end side of the tilt stage portion 31. The recessed portion 38 allows entry of the other end side of the movable table 47 in the tilt axis direction (Y-axis direction) to allow clockwise rotational displacement, in the drawing, of the movable table 47, which is supported by the stopper 36 such that the mount surface 48 is perpendicular to the optical axis (Z-axis) of the ion beam 2, about the shaft portion 49. Note that the stopper 36 regulates counterclockwise rotational displacement, in the drawing, of the movable table 47 from the state in which the mount surface 48 is perpendicular to the optical axis (Z-axis) of the ion beam 2.

In addition, a spring member 39 as a rotation restoring member is provided in the recessed portion 38. The spring member 39 causes the other end side of the movable table 47, which has entered the recessed portion 38 by rotating about the shaft portion 49, to move out of the recessed portion 38 and restore the movable table 47 to a state in which it is supported by the stopper portion 36 such that the mount surface 48 is perpendicular to the optical axis (Z-axis) of the ion beam 2. The rotation restoring member of the movable table 47 is not limited to the spring member 36 and can be replaced with other elastic members (e.g., a rubber member) as long as it can generate reaction force that would cause one end side portion of the rear surface of the movable table 47, which has been moved away from the stopper portion 36 through rotational displacement, to restore to and abut the stopper portion 36.

Accordingly, the sample table oscillation unit 40 including the movable table 47 is supported in a manner rotatable and displaceable with respect to the tilt stage portion 31 of the sample stage 30 about the axis (X-axis) that extends in a direction perpendicular to the plane (Z-Y plane) defined by the optical axis (Z-axis) of the ion beam 2 and the tilt axis (Y-axis) of the tilt stage portion 31 that is perpendicular to the optical axis, namely, the shaft portion 49. Then, the processing target surface 3*a* of the sample 3 fixedly mounted on the sample table 42 of the sample table oscillation unit 40 can change state from a surface state in which the processing target surface 3*a* faces the tilt axis direction (Y-axis direction) and is along the optical axis direction (Z-axis direction) of the ion beam 2 to a surface state in which the processing target surface 3*a* is tilted toward the ion gun 20 side in the optical direction of the ion beam 2 and in which the processing target surface 3*a* crosses the optical axis (Z-axis) of the ion beam 2 at a low angle.

In addition, the oscillator 50 that oscillates the other end side, which is a free end, of the movable table 47 is attached to the other end side of the movable table 47 of the sample table oscillation unit 40. For the oscillator 50, an oscillating motor with a structure in which an eccentric weight is attached to the tip end of a rotating shaft of a motor is used, for example. In such a case, by arranging the oscillating motor on the other end side of the movable table 47 such that the distance from the shaft portion 49 to the eccentric weight in the longitudinal direction from one end side to the other end side of the movable table 47 is the longest, it becomes possible to effectively convert small oscillation generated by the oscillating motor into a moment of rotational displacement of the sample table 47 or the sample table oscillation unit 40. Thus, it is possible to use an oscillating motor that generates small oscillation. Accordingly, it is possible to suppress an increase in the size and weight of the sample table oscillation unit 40 as much as possible, and also suppress the influence of the sample table oscillation unit 40 on the shake of the attached tilt stage portion 31.

The oscillating motor that constitutes the oscillator 50 is connected to the sample table control unit 35 via a wire (not shown). Actuation of the oscillator 50 as well as the aforementioned sample stage driving mechanism 34 is controlled by the sample table control unit 35.

Consequently, in the sample table oscillation unit 40, while the drive of the oscillating motor, namely, the oscillator 50 is stopped, one end side of the rear surface of the movable table 47 is in abutment with and supported by the stopper portion 36 of the unit holding portion 33 of the tilt stage portion 31 of the sample stage 30. Thus, the processing target surface 3a of the sample 3 fixedly mounted on the sample table 42 faces the tilt axis direction (Y-axis direction). Meanwhile, in the sample table oscillation unit 40, when the oscillating motor, namely, the oscillator 50 is driven and the oscillation is applied to the other end side of the movable table 47 that faces the recessed portion 38, the one end side of the movable table 47, which is positioned on the opposite side in the tilt axis direction (Y-axis direction) of the tilt stage portion 31, repeatedly abuts and moves away from the stopper portion 36 of the unit holding portion 33 of the tilt stage portion 31, around the shaft portion 49. Along this, the processing target surface 3a of the sample 3 fixedly mounted on the sample table 42 of the sample table oscillation unit 40 repeats tilt and tilt/restoration between a surface state in which the processing target surface 3a faces the tilt axis direction (Y-axis direction) and is along the optical axis direction (Z-axis direction) of the ion beam 2 and a tilted surface state in which a portion of the processing target surface 3a on the sample table side protrudes in the tilt axis direction (Y-axis direction) than does a portion of the processing target surface 3a on the mask side and in which the processing target surface 3a crosses the optical axis (Z-axis) of the ion beam 2 at a low angle. The sample table control unit 35 can, by changing the rotation speed of the oscillating motor that constitutes the oscillator 50, freely change the setting of the tilt-oscillation speed.

Next, an ion milling processing method for the processing target surface 3a of the sample 3 using the aforementioned ion milling device 1 in accordance with this embodiment will be described.

In the following description, repetition of tilt and tilt/restoration, by the actuation of the aforementioned sample stage driving mechanism 34, of a sample surface that extends in a direction that crosses a plane defined by the tilt axis (Y-axis) of the tilt stage portion 31 of the sample stage 30 and the optical axis (Z-axis) of the ion beam 2, namely, of the processing target surface 3a of the sample 3 about the tilt axis (Y-axis) in the horizontal direction along a plane that is orthogonal to the plane defined by the tilt axis and the optical axis of the ion beam 2 will be abbreviated to "swing" of the sample 3 with respect to the optical axis (Z-axis) of the ion beam 2. Meanwhile, repetition of tilt and tilt/restoration, by the actuation of the oscillator 50, of the processing target surface 3a of the sample 3 between a surface state in which the processing target surface 3a of the sample 3 faces the tilt axis direction (Y-axis direction) and a tilted surface state in which a portion of the processing target surface 3a on the sample table side protrudes in the tilt axis direction (Y-axis direction) than does a portion of the processing target surface 3a on the mask side will be abbreviated to "tilt-oscillation" of the sample 3 with respect to the optical axis (Z-axis) of the ion beam 2.

Figure 3:
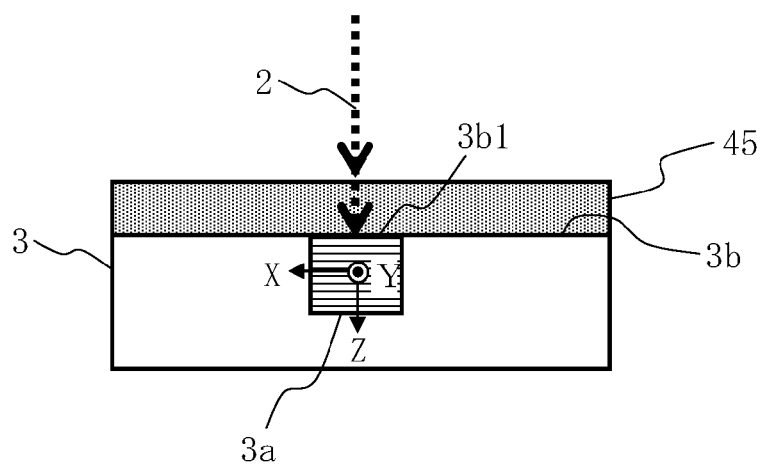
FIG. 3 is a schematic structure diagram of an embodiment of a sample table oscillation unit of an ion milling processing device in accordance with this embodiment.
Figure 3:
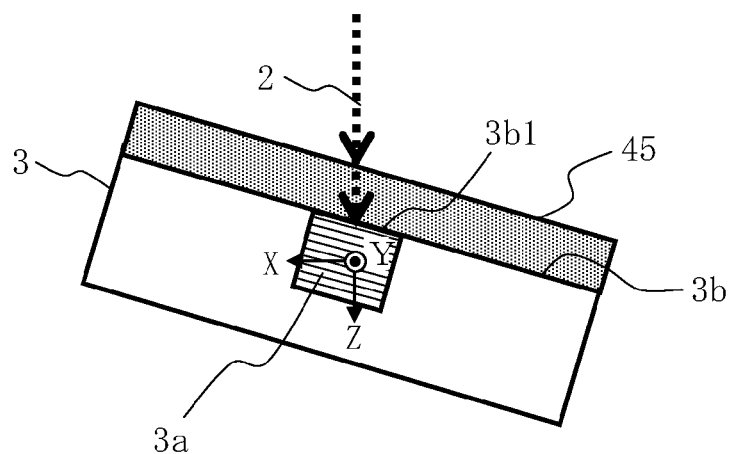
Figure 3:
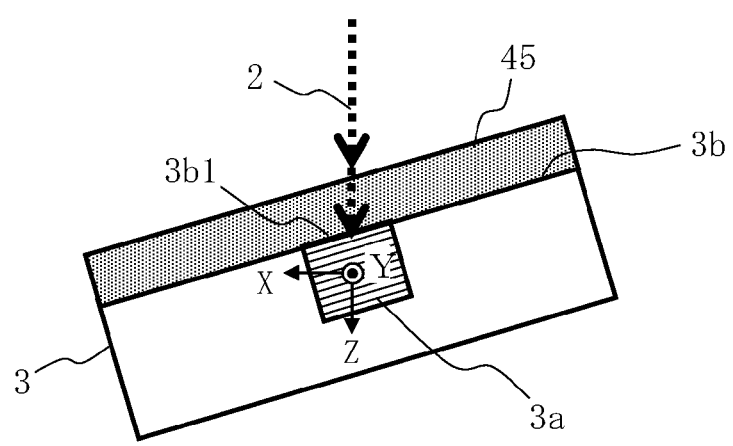

FIG. 3 is an illustration diagram of a swung state of a sample when the ion milling device in accordance with this embodiment is processing the sample.

FIG. 3 shows a view in which, in FIG. 2, motions of the sample 3 and the mask 45 of the sample table oscillation unit 40 in a shaken state, in which the tilt stage portion 31 is shaken about the tilt axis (Y-axis) by the actuation of the sample stage driving mechanism 34, are viewed from the side of the processing target surface along the tilt axis direction (Y-axis direction).

FIG. 3(a) shows, as the swung state of the sample 3, a swung state of the sample 3 in which the exposed irradiation target region 3b1 of the sample 3, which is not shielded by the mask 45, of the surface 3b on the opposite side of the sample mount surface is orthogonal to the optical axis (Z-axis) of the ion beam 2. That is, FIG. 3(a) corresponds to a state in which the exposed irradiation target region 3b1 of the sample 3 is not tilted with respect to the optical axis of the ion beam 2, and thus is in the horizontal state.

In contrast, FIGS. 3(b) and 3(c) each show a swung state of the sample 3 in which the exposed irradiation target region 3b1, which is not shielded by the mask 44, of the surface 3b on the opposite side of the sample mount surface is not orthogonal to the optical axis (Z-axis) of the ion beam 2. That is, FIGS. 3(b) and 3(c) each correspond to a state in which the exposed irradiation target region 3b1 of the sample 3 is tilted with respect to the optical axis of the ion beam 2.

Thus, in the shaken state in which the tilt stage portion 31 is shaken about the tilt axis (Y-axis) by the actuation of the sample stage driving mechanism 34, the processing target surface 3a of the sample 3 repeats tilt and tilt/restoration of, for example, FIG. 3(a)→FIG. 3(b)→FIG. 3(a)→FIG. 3(c)→FIG. 3(a)→ . . . with respect to the horizontal direction (X-axis direction) along a plane (X-Z plane) that is orthogonal to a plane (Y-Z plane) defined by the tilt axis (Y-axis) and the optical axis (Z-axis) of the ion beam 2, in accordance with the shake range and shake period of the tilt stage portion 31.

Accordingly, in FIG. 2, a mechanism is provided in which the sample portion of the irradiation target region 3b1 irradiated with the ion beam 2, which protrudes in the tilt axis direction (Y-axis direction) from the mask end surface 45a, is cut away by the ion beam 2, so that a final processed surface 3a' is processed. In this case, swinging the sample 3 can reduce generation of thread-like projections/recesses on the fabricated processed surface 3a'.

However, when a void 61 or a dissimilar material (a material with a composition that differs in sputter efficiency) exists at the cut portion of the sample 3 corresponding to the irradiation target region 3b1 irradiated with the ion beam 2, thread-like projections/recesses 63 are generated on the final processed surface 3a' along the shape of the void or the dissimilar material.

Figure 4:
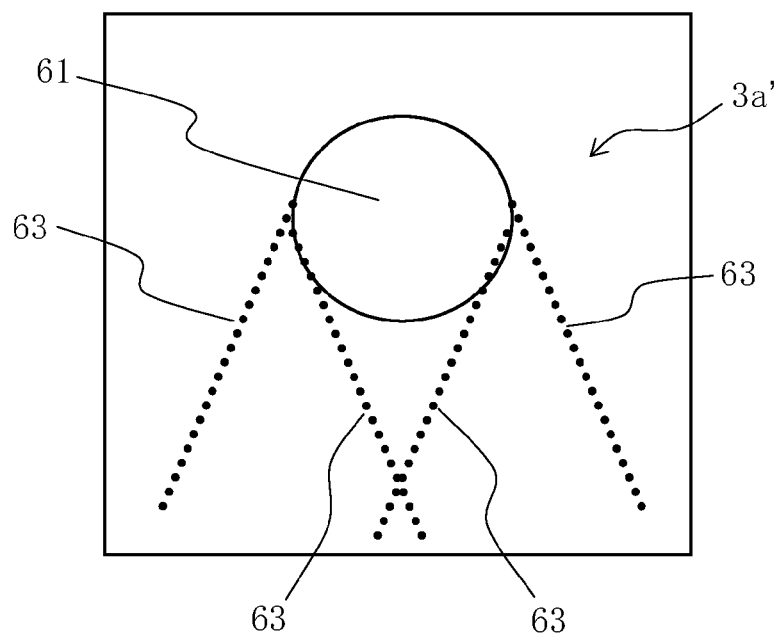
FIG. 4 is an illustration diagram of thread-like projections/recesses produced on the final processed surface due to a void and a dissimilar material.
Figure 4:
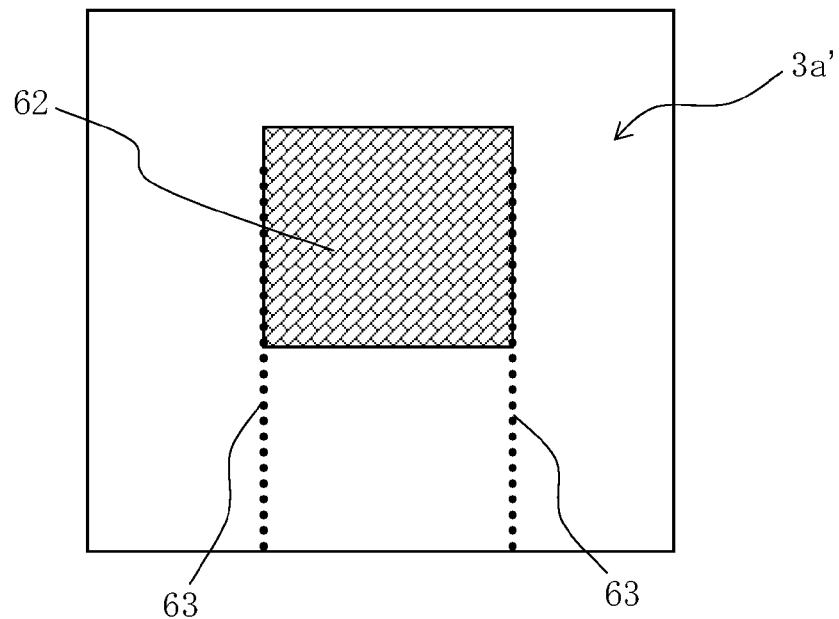

FIG. 4 is an illustration diagram of thread-like projections/recesses produced on the final processed surface due to a void and a dissimilar material.

As shown in FIG. 4(a), when a void 61 is generated on the cut portion of the sample 3, thread-like projections/recesses 63 are generated on the final processed surface 3a', which is a sample cross section along the optical axis direction (Z-axis direction) of the ion beam 2 produced by irradiating the sample 3 with the ion beam 2 while swinging the sample 3, along the shape of the void 61. Likewise, as shown in FIG. 4(b), when a dissimilar material 62 exists on the cut portion of the sample 3, thread-like projections/recesses 63 are generated along the shape of the dissimilar material 62.

In the ion milling device 1 in accordance with this embodiment, when sample processing is performed with the sample 3 in the swung state, the sample 3 is tilted/oscillated so that thread-like projections/recesses 63 generated on the final processed surface 3a' along the shape of the void 61 or the dissimilar material 62 existing on the cut portion of the sample 3 can be reduced.

Figure 5:
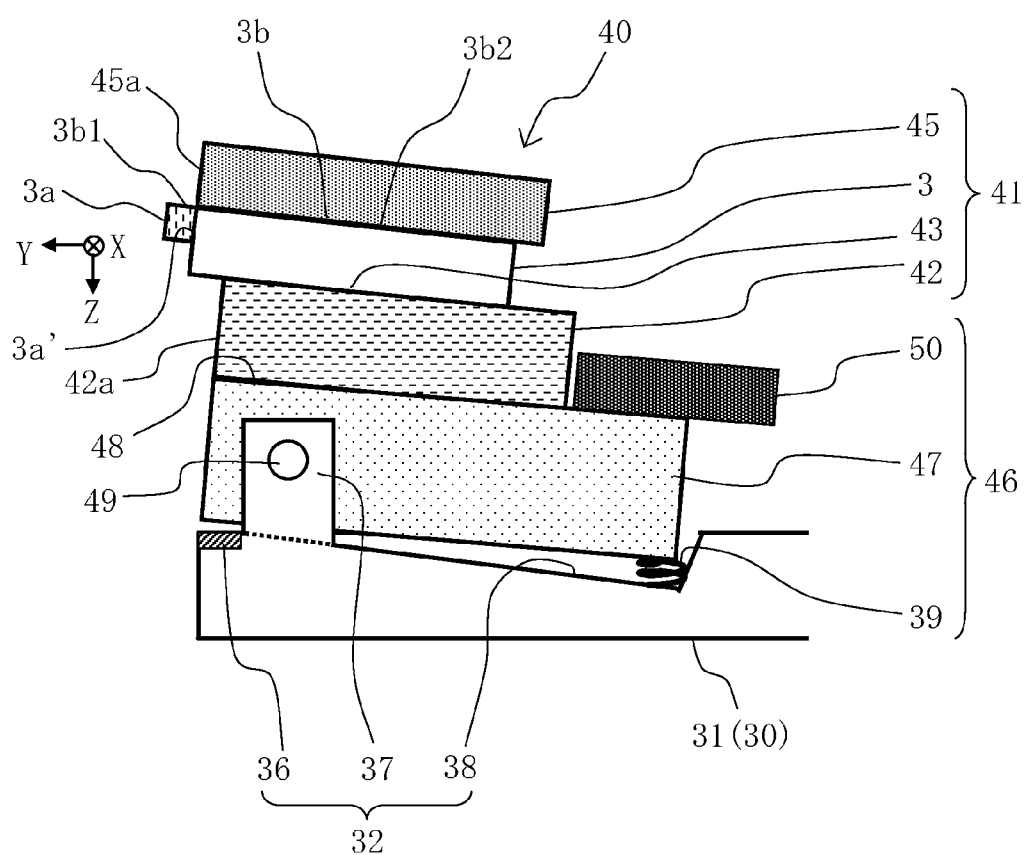
FIG. 5 is an illustration diagram of a tilt-oscillation state when a sample is processed by an ion milling device in accordance with this embodiment.

FIG. 5 is an illustration diagram of a tilt-oscillation state when sample processing is performed by the ion milling device in accordance with this embodiment FIG. 5 shows a tilted surface state in which, in the tilt-oscillation state of the sample 3, a portion of the processing target surface 3a on the sample table side protrudes in the tilt axis direction than does a portion of the processing target surface 3a on the mask side relative to a surface state in which the processing target surface 3a of the sample 3 faces the tilt axis direction (Y-axis direction) and is along the optical direction (Z-axis direction) of the ion beam 2.

That is, by the actuation of the oscillator 50, the sample table oscillation unit 40 in which the movable table 47 is in abutment with and supported by the stopper portion 36 of the unit holding portion 33 of the tilt stage portion 31 repeats tilt and tilt/restoration with respect to the tilt stage portion 31 of the sample stage 30 about the shaft portion 49, which extends in a direction perpendicular to the plane (Y-Z plane) defined by the tilt axis (Y-axis) and the optical axis (Z-axis) of the ion beam 2, between a surface state in which the processing target surface 3a of the sample 3 faces the tilt axis direction (Y-axis direction) and is along the optical axis direction (Z-axis direction) of the ion beam 2 and a tilted surface state in which a portion of the processing target surface 3a on the sample table side protrudes in the tilt axis direction (Y-axis direction) than does a portion of the processing target surface 3a on the mask side. That is, the sample table oscillation unit 40 shakes along the plane (Y-Z plane) defined by the tilt axis (Y-axis) and the optical axis (Z-axis) of the ion beam 2 about the shaft portion 49 that is perpendicular to the plane (Y-Z plane) defined by the tilt axis (Y-axis) and the optical axis (Z-axis) of the ion beam 2, and the processing target surface 3a is tilted/oscillated in the optical axis direction (Z-axis direction).

In this case, in the tilted state of the sample 3 shown in FIG. 5, the processing target surface 3a is in the tilted surface state in which the optical axis of the ion beam 2 crosses the processing target surface 3a at a low angle, so that the processing target surface 3a is irradiated with the ion beam 2 at a low angle.

Figure 6:
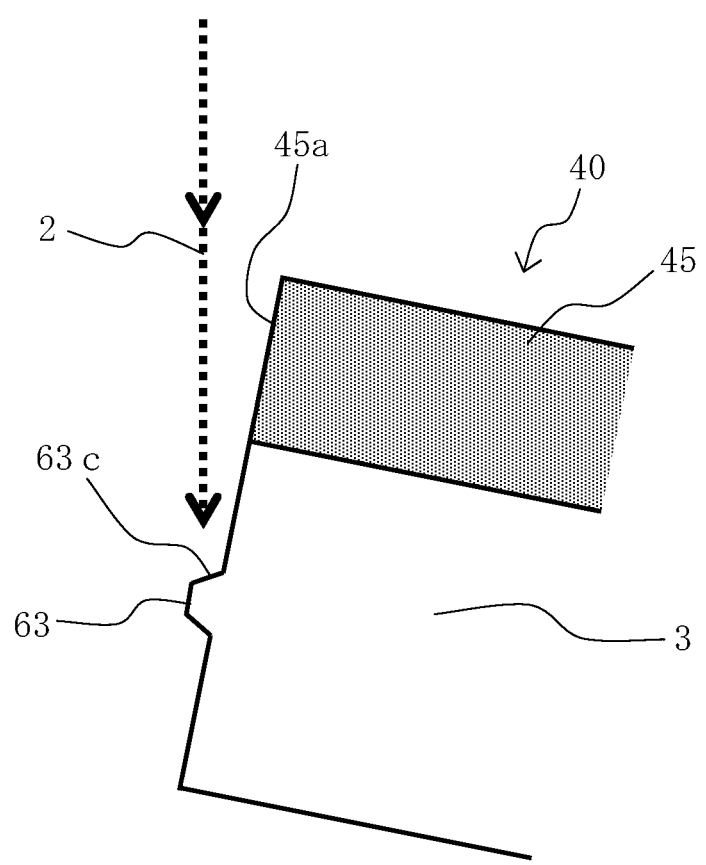
FIG. 6 is a diagram illustrating the relationship between thread-like projections/recesses produced on the processing target surface due to a void or a dissimilar material and the ion beam irradiation when the processing target surface of the sample is in the tilted surface state.

FIG. 6 is a diagram illustrating the relationship between thread-like projections/recesses produced on the processing target surface due to a void or a dissimilar material and the ion beam irradiation when the processing target surface of the sample in the tilted surface state.

As shown in FIG. 6, in the tilted state of the sample 3, the processing target surface 3a produced by irradiating the sample 3 on the sample table oscillation unit 40 with the ion beam 2 while swinging the sample 3 as described above is irradiated with the ion beam 2 at a low angle, while a side surface 63c of the projection portion of the thread-like projections/recesses 63 generated on the processing target surface 3a is irradiated with the ion beam 2 at a higher angle than the processing target surface 3a. Accordingly, the milling rate of the sputtering of the processing target surface 3a with the ion beam 2 significantly becomes smaller than the milling rate of the sputtering of the side surface 63c of the thread-like projections/recesses 63 with the ion beam 2. Accordingly, in the tilted state of the sample 3, so-called flat milling can be performed in which the processing target surface 3a is smoothed with the thread-like projections/recesses 63 removed.

By the tilt-oscillation of the sample 3 through actuation of the oscillator 50 of the sample table oscillation unit 40, it is possible to concurrently perform cutting of the sample portion of the irradiation target region 3b1, which protrudes from the mask end surface 45a in the tilt axis direction (Y-axis direction), with the ion beam 2 and smoothing of the processing target surface 3a.

During the period, the sample table oscillation unit 40 is regulated so that its movable table 47 does not abut the stopper portion 36, which would otherwise cause the processing target surface 3a of the sample 3 to be in the overhung state in which a portion of the processing target surface 3a on the mask side protrudes in the tilt axis (Y-axis) direction than does a portion of the processing target surface 3a on the sample table side. Accordingly, it is possible to avoid a circumstance in which the processing target surface 3a of the sample 3 is not irradiated with the ion beam 2 at all, which would otherwise produce a time in which the processing target surface 3a of the sample 3 cannot be processed at all.

In the ion milling device 1 in accordance with this embodiment, when the processing target surface 3a of the sample 3 is processed through irradiation with the ion beam 2, the sample table control unit 35 first actuates the sample stage driving mechanism 34 in starting irradiation with the ion beam 2. Accordingly, the sample stage driving mechanism 34 swings the sample 3 on the sample table oscillation unit 40, and irradiates the irradiation target region 3b1 to be irradiated with ion beam 2, which protrudes from the mask end surface 34a in the tilt axis direction (Y-axis direction), with the ion beam 2 at a high angle, thereby cutting away a sample portion of the irradiation target region 3b1 irradiated with the ion beam 2, and producing the processing target surface (the sample cross section) 3a of the sample 3 that is along the optical axis direction of the ion beam 2. Then, when cutting of a corresponding sample portion is advanced by the irradiation of the irradiation target region 3b1 with the ion beam 2 to an extent that the processing target surface 3a becomes close to the final processed surface 3a' defined by the mask end surface 45a, the sample table control unit 35 stops the actuation of the sample stage driving mechanism 34, and then actuates the oscillator 50. Accordingly, the ion milling device 1 concurrently performs cutting of the sample portion of the irradiation target region 3b1, which protrudes from the mask end surface 45a in the tilt axis direction (Y-axis direction), through irradiation with the ion beam 2 and smoothing of the processing target surface 3a, thereby removing the thread-like projections/recesses 63 generated on the processing target surface 3a due to the void 61 or the dissimilar material 62. Upon termination of the processing of the final processed surface 3a', the sample table control unit 35 stops the actuation of the oscillator 50.

The ion milling device 1 and the ion milling processing method in accordance with this embodiment have been described above. Hereinafter, another embodiment in accordance with the present invention will also be described.

First, in the aforementioned ion milling device 1, the tilt angle of the movable table 47, which is tilted/oscillated by receiving oscillation from the actuated oscillator 50, and the amount of rotational displacement of the sample table oscillation unit 40 about the shaft portion 49 are constant in accordance with the depth of the recessed portion 38 that permits entry of the other end side of the movable table 47 through the rotation thereof or the magnitude of the biasing force of the spring member 39 serving as a rotation restoring member, but can also be configured to be variable. In that case, for example, the tilt angle of the movable table 47 can be configured to be freely set by adjusting the depth of the recessed portion 38 of the unit holding portion 33 of the tilt stage portion 31 of the sample stage 30 by, for example, disposing a spacer with an appropriate size in the recessed portion 38 or designing the biasing force of the spring member 39 to be variable.

This will be useful in selectively performing processing since the frequency of generation of the thread-like projections/recesses 63 on the processing target surface due to the void 61 or the dissimilar material 62, and the size of the thread-like projections/recesses 63 generated on the processing target surface due to the void or the dissimilar material would differ depending on the difference of a plurality of samples 3, for example, the difference in the composition materials of the samples 3. For example, when the size of the thread-like projections/recesses 63 is small, the tilt angle between the orientation of the sample surface needed to remove the projections/recesses (e.g., in the example shown in FIG. 6, the orientation of the side surface 63 of the projection portion of the projections/recesses 63) and the orientation of the optical axis of the ion beam 2 is a little shallow, about 10 degrees. Meanwhile, when the size of the thread-like projections/recesses 63 is large, the tilt angle between the orientation of the sample surface needed to remove the projections/recesses (e.g., in the example shown in FIG. 6, the orientation of the side surface 63 of the projection portion of the projections/recesses 63) and the orientation of the optical axis of the ion beam 2 is a little deep, about 20 degrees. Typically, in the case of void-based projections/recesses 63, the size of the projections/recesses 63 is small; thus, the projections/recesses 63 are removed by ion beam irradiation in a shallow tilt angle range (zero to 10 degrees), while in the case of dissimilar metal-based projections/recesses 63, the size of the projections/recesses 63 is large; thus, the projections/recesses 63 are removed by ion beam irradiation in a tilt angle range (zero to 20 degrees) including more deeper tilt angles.

In the aforementioned ion milling device 1, the sample table control unit 35 is configured to perform swinging and tilt-oscillation of the sample 3 on the sample table oscillation unit 40 by separately actuating the sample stage driving mechanism 34 and the oscillator 50 in processing the processing target surface 3a through irradiation with the ion beam 2. However, it is also possible to perform a shake, tilt, and displacement of the processing target surface 3a of the sample 3 with respect to the optical axis of the ion beam 2 in a combined manner by swinging and tilt-oscillating the processing target surface 3 of the sample 3 by actuating the oscillator 50 concurrently with the actuation of the sample stage driving mechanism 34.

In this case, it is not necessary to concurrently perform swinging and tilt-oscillation of the sample 3 on the sample table oscillation unit 40 from the beginning of the processing of the processing target surface 3a of the sample 3 with the ion beam 2. It is acceptable as long as swinging and tilt-oscillation of the sample 3 on the sample table oscillation unit 40 are performed concurrently at the last stage of the processing of the processing target surface 3a of the sample 3.

Figure 7:
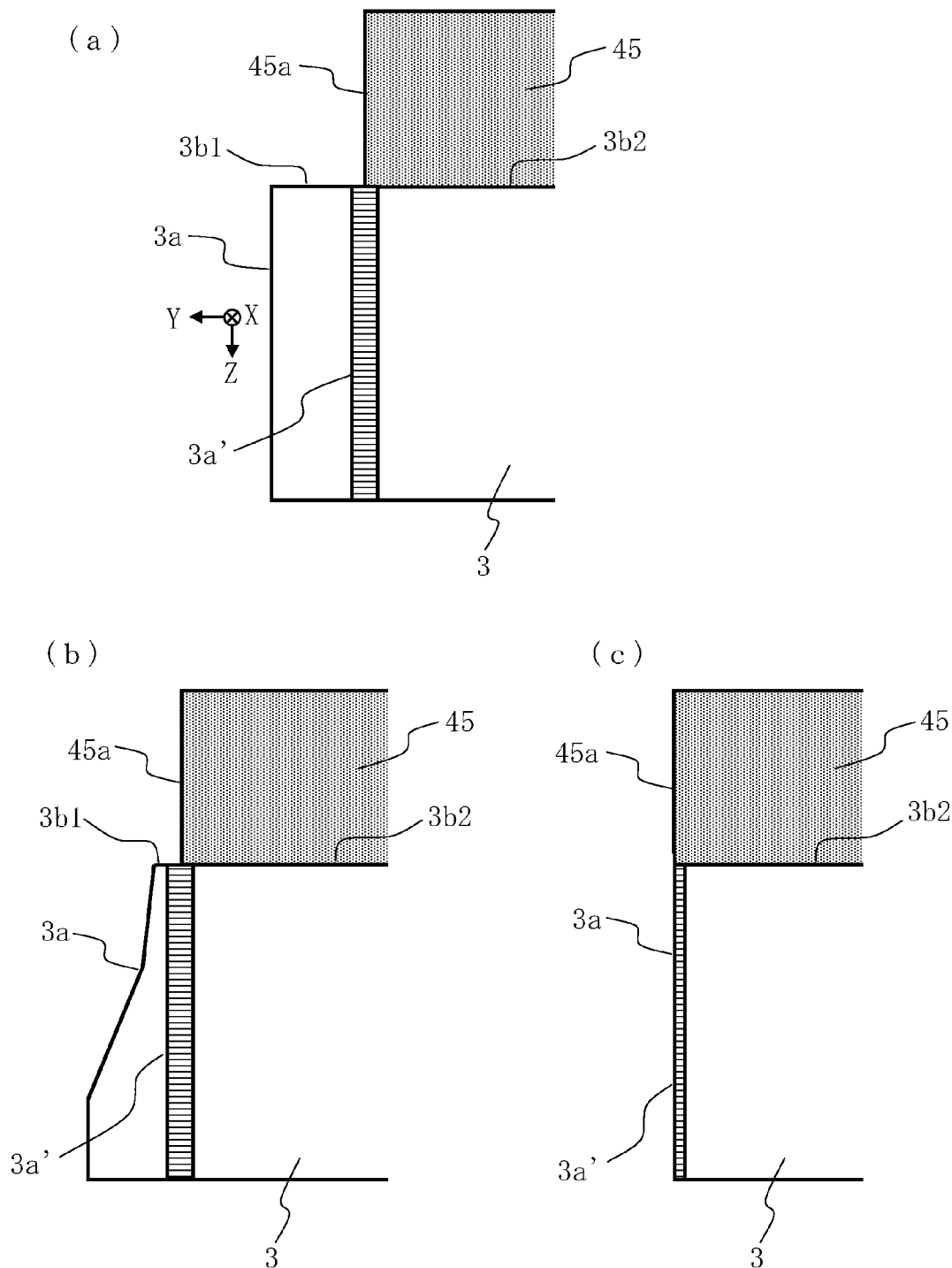
FIG. 7 shows another embodiment of ion milling processing method control that is controlled by a sample table control unit of the ion milling device shown in FIG. 1.

FIG. 7 shows another embodiment of ion milling processing method control that is controlled by the sample table control unit of the ion milling device shown in FIG. 1.

FIG. 7 is a diagram showing the control procedures of the ion milling processing method controlled by the sample table control unit 35 of the ion milling device 1 in chronological order.

At the beginning of the processing of the processing target surface 3a of the sample 3 with the ion beam 2 shown in FIG. 7(a), the sample table control unit 35 first actuates only the sample stage driving mechanism 34. Accordingly, the sample stage driving mechanism 34 swings the sample 3 on the sample table oscillation unit 40, and irradiates the irradiation target region 3b1 to be irradiated with the ion beam 2, which protrudes from the mask end surface 45 in the tilt axis direction (Y-axis direction), with the ion beam 2 at a high angle, thereby cutting away the sample portion of the irradiation target region 3b1 irradiated with the ion beam 2 to produce a processing target surface (a sample cross section) 3a of the sample 3 that is along the optical axis direction of the ion beam 2.

At the beginning of the processing, the sample 3 protrudes from the mask end surface 45a of the mask 45 in the tilt axis direction (Y-axis direction), and the irradiation target region 3b1 to be irradiated with the ion beam 2, which protrudes from the mask end surface 45a in the tilt axis direction (Y-axis direction), remains. Thus, the processing target surface (the sample cross section) 3a of the sample 3 that is along the optical axis direction of the ion beam 2 has not reached the final processed surface 3a' yet by the irradiation with the ion beam 2.

At the middle stage of the processing of the processing target surface 3a of the sample 3 with the ion beam 2 shown in FIG. 7(b), cutting of the sample portion of the irradiation target region 3ba to be irradiated with the ion beam 2, which protrudes from the mask end surface 45a of the mask 45, starts, and the processing target surface (the sample cross section) 3a gradually becomes closer to the final processed surface 3a'.

At the last stage of the processing of the processing target surface 3a of the sample 3 with the ion beam 2 shown in FIG. 7(c), the processing target surface 3a reaches the final processed surface 3a'.

At this time, unnecessary projections/recesses 63 start to be generated on the processed cross section due to the shape or size of the void 61 or the difference in sputter efficiency of the dissimilar material 62. Thus, tilting effected by oscillation may be started from this time point. In an embodiment, tilt-oscillation may be started in addition to swinging the sample 3 on the sample table oscillation unit 40 for the last about 5 to 30 minutes of the processing time, so that low-angle ion beam irradiation may be performed by combined tilting of the sample 3 by the swinging and the tilt-oscillation of the sample table oscillation unit 40.

For the time setting therefor, an object with a high milling rate may be processed in a short time, while an object with a low milling rate (hard objects such as ceramics) may be processed in a long time, whereby a reduction of projections/recesses in accordance with a sample becomes possible in production of a cross section.

Therefore, the sample table control unit 35, upon reaching the last predetermined minutes (about 5 to 30 minutes) of the processing time set in advance, for example, starts to actuate the oscillator 50 while continuing the actuation of the sample stage driving mechanism 34, thereby concurrently performing swinging and tilt-oscillation of the sample table oscillation unit 40. Although the sample table control unit 35 herein is configured to start actuation of the oscillator 50 upon reaching the last predetermined minutes (about 5 to 30 minutes) of the processing time, it is also possible to, if a monitoring means capable of directly checking the amount of processing (the amount of cutting) is provided, start actuation of the oscillator 50 on the basis of the remaining amount of cutting of the processing target surface 3a relative to the final processed surface 3a', taking into consideration the aforementioned milling rate.

As described above, if swinging and tilt-oscillation of the sample table oscillation unit 40 are performed concurrently at the last stage of the processing of the processing target surface 3*a* of the sample 3 with the ion beam 2, it is possible to, even when a sample to be processed contains a void 61 or a material 62 with a composition that differs in sputter efficiency (a dissimilar material), prevent generation of thread-like projections/recesses 63 on the final processed surface 3*a'* due to the void or the material. Thus, it is possible to obtain a smooth final processed surface 3*a'* and suppress an increase in the processing time therefor, resulting in efficient fabrication of a sample cross section.

REFERENCE SIGNS LIST

1 Ion milling device
2 Ion beam
3 Sample
10 Vacuum chamber
11 Exhaust port
12 Vacuum evacuation system
13 Vacuum evacuation control unit
14 Sample transport port
20 Ion gun (ion bean source)
21 Ion gun control unit
30 Sample stage
31 Tilt stage portion
32 Cap portion
33 Unit holding portion
34 Sample stage driving mechanism
35 Sample table control unit
36 Stopper portion
37 Shaft attachment portion
38 Recessed portion
39 Spring member
40 Sample table oscillation unit
41 Mask unit portion
42 Sample Table
43 Sample mount surface
45 Mask
46 Movable portion
45 Oscillator
46 Operating portion
47 Movable Table
48 Mount surface
49 Shaft portion
50 Oscillator (Oscillating motor)
61 Void
62 Dissimilar material
63 Thread-like projections/recesses The present disclosure contains the publications, patents, and patent applications cited in the specification, the entire content of which is hereby incorporated by reference.

The invention claimed is:

1. An ion milling device comprising:
a sample table holding a sample that is partially shielded by a mask;
a swinging mechanism that shakes the sample table about a first axis as a tilt axis, the first axis having an axial direction that is perpendicular to an optical axis of an ion beam emitted from an ion beam source; and
a tilt-oscillation mechanism that tilts the sample held on the sample table about a second axis as a tilt axis, the second axis being orthogonal to both the optical axis of the ion beam and the first axis,
wherein the tilt-oscillation mechanism shakes the sample such that a processing target surface of the sample that is formed along the optical axis of the ion beam is repeatedly switched between a first state in which the processing target surface of the sample is oriented along the optical axis of the ion beam and a second state in which the processing target surface of the sample is tilted toward the ion beam source side.

2. The ion milling device according to claim 1, wherein the tilt-oscillation mechanism includes setting means for changing an angle at which the processing target surface of the sample is made to cross the optical axis of the ion beam in a range from 0 to 20 degrees.

3. The ion milling device according to claim 1, wherein the tilt-oscillation mechanism includes a stopper portion that regulates a shake so as to prevent the processing target surface of the sample on the mask side from projecting in the axial direction than does the processing target surface on the sample table side.

4. An ion milling processing method comprising:
a cross section producing step of, by shaking a sample table holding a sample that is partially shielded by a mask about a first axis as a tilt axis, the first axis having an axial direction that is perpendicular to an optical axis of an ion beam emitted from an ion beam source, producing a processing target surface of the sample that is defined by the mask and is oriented along the optical axis of the ion beam; and
a smoothing step of smoothing projections or recesses produced on the processing target surface of the sample by execution of the cross section producing step by shaking the sample held on the sample table about a second axis as a tilt axis, the second axis being orthogonal to both the optical axis of the ion beam and the first axis, such that the processing target surface of the sample that is formed along the optical axis of the ion beam is repeatedly switched between a first state in which the processing target surface of the sample is oriented along the optical axis direction of the ion beam and a second state in which the processing target surface of the sample is tilted toward the ion beam source side.

5. The ion milling processing method according to claim 4, further comprising a step of changing an angle at which the processing target surface of the sample is made to cross the optical axis of the ion beam in a range from 0 to 20 degrees in accordance with a type of the sample to be processed.

6. The ion milling processing method according to claim 4, wherein the smoothing step is executed concurrently with the cross section producing step at a last stage of processing in the cross section producing step.

* * * * *